United States Patent [19]

Berger et al.

[11] Patent Number: 5,225,706

[45] Date of Patent: Jul. 6, 1993

[54] MATRIX OF PHOTOSENSITIVE ELEMENTS ASSOCIATING A PHOTODIODE OR A PHOTOTRANSISTOR AND A STORAGE CAPACITOR

[75] Inventors: Jean L. Berger; Marc Arques, both of Grenoble, France

[73] Assignee: Thomson-CSF, Paris, France

[21] Appl. No.: 660,235

[22] Filed: Feb. 25, 1991

Related U.S. Application Data

[63] Continuation of Ser. No. 277,952, Nov. 30, 1988, abandoned.

[30] Foreign Application Priority Data

Dec. 4, 1987 [FR] France .................. 87 16865

[51] Int. Cl.⁵ .............. H01L 27/14; H01L 31/00; H01L 27/02
[52] U.S. Cl. ...................... 257/446; 257/53; 257/448; 257/458; 257/459; 257/463; 257/466; 257/532; 257/656
[58] Field of Search ............ 357/58, 51, 2, 30 D, 357/30 F, 30 H, 30 K, 30 P, 30 Q; 257/446, 448, 458, 459, 463, 466, 656, 53, 532

[56] References Cited

U.S. PATENT DOCUMENTS

| | | | |
|---|---|---|---|
| 3,521,244 | 7/1970 | Weimer | 357/58 |
| 3,916,268 | 10/1975 | Engeler et al. | 357/23 |
| 4,532,373 | 7/1985 | Matsuura et al. | 357/58 |
| 4,572,881 | 2/1986 | Yamazaki | 357/58 |
| 4,732,873 | 3/1988 | Perbet et al. | 357/58 |
| 4,820,915 | 4/1989 | Hamakawa et al. | 357/2 |
| 4,839,709 | 6/1989 | Zurakowski | 357/58 |
| 4,868,614 | 9/1989 | Yamazaki | 357/58 |
| 5,032,540 | 7/1991 | Follegot | 437/142 |

FOREIGN PATENT DOCUMENTS

0233104 8/1987 European Pat. Off. .

*Primary Examiner*—Jerome Jackson
*Assistant Examiner*—Ngan Van Ngo
*Attorney, Agent, or Firm*—Oblon, Spivak, McClelland, Maier & Neustadt

[57] ABSTRACT

In a matrix array of photosensitive elements, each photosensitive point is provided with a photosensitive element (pin photodiode) in series with a capacitor between a row lead and a column lead. It is proposed to make use of a simplified photosensitive element in which an end semiconductor layer is suppressed such as, for example, the n-layer of a pin photodiode or the n-layer of a five-layer phototransistor of the nipin type. The dielectric of the capacitor then comes directly into contact with an intrinsic semiconductor layer in which electrons accumulate. These electrons reconstitute the equivalent of an n-type doped layer.

12 Claims, 2 Drawing Sheets

MATRIX OF PHOTOSENSITIVE ELEMENTS ASSOCIATING A PHOTODIODE OR A PHOTOTRANSISTOR AND A STORAGE CAPACITOR

This application is a continuation of application Ser. No. 07/277,952, filed on Nov. 30, 1988, now abandoned.

BACKGROUND OF THE INVENTION

1. Field of the Invention

The present invention relates to strips or matrices of photosensitive elements

2. Description of the Prior Art

In order to construct matrices sensitive elements, it is a standard practice to provide an array of row leads and an array of column leads with a respective photosensitive element at each intersection of a row and a column. The row array is used to select a row of photosensitive elements whose electrical output signals are to be determined. The array of column leads is used to read a respective output signal for each element of the selected row.

One method for permitting individual selection of a row and individual reading on each column consists in employing at each point of the matrix the association of a photosensitive element proper and an access transistor. The photosensitive element is a photodiode or a phototransistor (this latter has the advantage of higher sensitivity or in other words of supplying a higher electric charge for the same illumination). This photodiode is connected by means of the access transistor to a column lead of the matrix. The transistor is controlled by a row lead (and all the photosensitive elements of the same row are thus connected to the same row conductor).

The disadvantage of this type of structure is that it involves the need to employ at each point of the matrix both a photodiode and an access transistor placed next to the photodiode. This structure is cumbersome on account of the area occupied by the access transistor at each point of the matrix.

In order to reduce the bulk and in fact in order to increase the resolution by housing a greater number of points in a given area, structures have been proposed in which the access transistor is suppressed and replaced by a capacitor which serves on the one hand to store the charges generated by the photodiode and on the other hand to isolate the photodiode from the column lead when the row corresponding to the photodiode is not selected.

A structure of this type is described for example in U.S. Pat. No. 4,797,560. The advantage of the capacitor with respect to the transistor is that it can be placed above and not next to the photodiode, thus reducing the bulk.

In particular, a practical method of construction of a matrix array of photosensitive elements consists in superposing three layers of p-doped, i-doped, and n-doped amorphous silicon and a dielectric layer, the entire assembly being sandwiched between a row lead and a column lead of the matrix.

Illumination of the photodiode takes place on one side or on the other and produces electric charges mainly in the intrinsic region of the diode. These charges accumulate at the interface between the photodiode and the capacitor or in other words within the n-type layer of the photodiode if the capacitor is located on the side corresponding to the n layer or within the p layer if this is not the case.

In accordance with the invention, it has been observed that it was possible in some cases to eliminate this doped layer entirely without substantially impairing the operation of the matrix except perhaps in regard to the speed of transfer of stored charges to the column lead through which reading of the signal generated by the photodiode is performed.

This possibility of suppression of the doped layer adjacent to the charged storage capacitor is based on the concept that a charge accumulation zone (of the same type as that of the doped layer) is formed at the interface between the photodiode and the capacitor as the illumination takes place.

In consequence, it is practically unnecessary to provide for veritable chemical doping of the interface in order to constitute a zone filled with free carriers.

SUMMARY OF THE INVENTION

In accordance with the invention, provision is accordingly made for an array of photosensitive elements in which each photosensitive point is provided between a row lead and a column lead with a photosensitive element in series with a capacitor, the photosensitive element being provided with at least one undoped (intrinsic or quasi-intrinsic) semiconductor layer, as distinguished by the fact that the capacitor is constructed of:
 the undoped layer in which charges accumulate as the illumination takes place;
 a dielectric layer in contact with said undoped layer;
 and a row or column lead in contact with the dielectric layer.

In the event that the photosensitive element is a pin photodiode, the structure at each point of the matrix becomes a superposition of a lead (row or column lead), a doped semiconductor layer in contact with the lead, an undoped (intrinsic or quasi-intrinsic) semiconductor layer, an insulating layer and another lead (column or row lead).

This arrangement makes it possible not only to eliminate a doping operation or deposition of a doped layer but also to improve the photoelectric efficiency since a greater part of the incident radiation is received by the intrinsic layer. Transmission losses within the n+ or p+ layer of the photodiode are suppressed and the efficiency in the case of short wavelengths of light (blue or violet) is distinctly improved since the absorption of the n+ or p+ layer was particularly strong at these wavelengths.

In an alternative embodiment of the invention, the photosensitive element in which a doped layer in contact with the dielectric of the capacitor is suppressed is not a pin photodiode but a phototransistor having five semiconductor layers of the nipin or pinip type. This structure will be described in detail hereinafter but it may already be noted that this structure has an unexpected character in the sense that the photosensitive matrices which employ as photosensitive point a photosensitive element in series with a capacitor without any access transistor for addressing a selected row of points exclude a priori the use of phototransistors as a photosensitive element.

In fact, if it was possible in the past to propose photosensitive points which employed a photodiode in series with a capacitor, it was because the charges generated by the illumination are stored at the interface between the diode and the capacitor and because reading can be performed by switching the photodiode into conduction in order to evacuate the stored charges towards the column lead (or in order to bring from the column lead a quantity of charges which compensates for the stored charges). This is a very easy matter with a photodiode which can be triggered into conduction quite simply by means of a forward-bias pulse (positive bias on the side corresponding to the anode, negative bias on the side corresponding to the cathode). But this is practically impossible with a floating-base phototransistor which can be triggered into conduction in a direction suited to evacuation of the stored charges only by avalanche connection of its base-emitter junction. This avalanche connection not only requires a fairly high bias voltage but in addition the resultant conduction current introduces substantial noise (transfer of parasitic charges which do not correspond to the charges generated by illumination). This problem is even more difficult to solve if the reading stage takes place in darkness.

The invention proposes to employ a matrix in which the photosensitive point is formed by a superposed assembly of nipi or pini layers, that is to say a nipin or pinip transistor in which one doped end-layer has been suppressed, with an insulating layer covering the intrinsic end-layer of the nipi or pini superposed assembly, the assembly being sandwiched between two leads consisting respectively of a row lead and a column lead of the matrix.

This arrangement with a kind of four-layer phototransistor is more favorable than the arrangement with a simple photodiode since, in the first place, the photoelectric efficiency of the phototransistor is higher than that of a pin photodiode and, in the second place, it has been observed that switching into conduction for evacuation of charges in the reading stage could be carried out at a voltage which is practically as low as the switching into conduction of a photodiode, even in darkness (reading will often take place in the dark) and without introducing a substantial charge noise. In order to optimize these problems of switching into conduction of the structure at the moment of reading of charges generated by photoelectric effect, it is ensured that the intrinsic layer located between two layers of opposite conductivity types is of a very small thickness (preferably of the order of 200 Angströms or less). Moreover, the intrinsic end-layer which is in contact with the insulating layer is of a much greater thickness and is preferably several thousand Angströms in order to ensure sufficient sensitivity.

The photosensitive matrix in accordance with the invention will preferably be formed by a superposed assembly of layers of hydrogenated amorphous silicon. These layers are in principle etched in order to define separate photosensitive islands constituting the photosensitive points of the matrix. However, it is also possible to make arrangements such that certain layers are not etched if the lateral conductivity between photosensitive points is sufficiently low, taking into account the light doping of certain layers or their small thickness.

DESCRIPTION OF THE PREFERRED EMBODIMENTS

Figure 1:
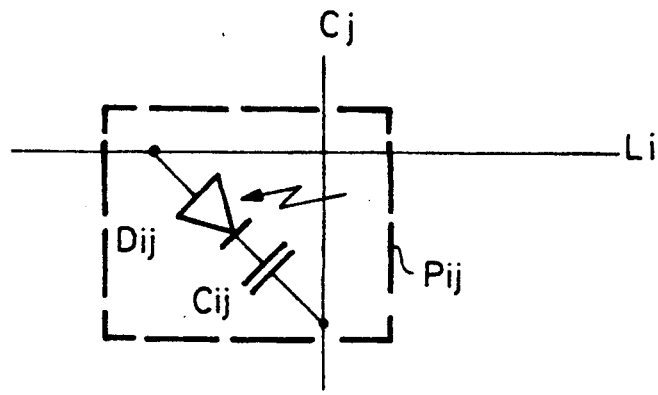
FIG. 1 represents schematically the electrical diagram of a photosensitive point of a matrix of known type.

In FIG. 1, there is shown schematically one point of a matrix of photosensitive points of the prior art. This matrix is made up of a certain number of rows and columns and each photosensitive point $P_{ij}$ is located at the intersection of a row $L_i$ of rank i and a column $c_j$ of rank j.

The row $L_i$ is materialized by a "horizontally" oriented electric conductor or "lead" and the column $c_j$ is materialized by a "vertically" oriented lead $C_j$.

The photosensitive point is composed of a photodiode $D_{ij}$ in series with a capacitor $C_{ij}$. This series assembly is connected between the row lead $L_i$ and the column lead $C_j$.

When the photodiode is illuminated, electric charges are generated and stored at the point of junction between the diode and the capacitor. Arrangements are made to ensure that, during illumination, the diode is reverse-biased both for low illumination and for high illumination (within the limits of normal operation permitted for the matrix).

Outside the illumination stage, the stored charges are read by forward-biasing the diode during a brief instant. This forward-biasing operation is carried out by bringing the row lead to a suitable potential and making it possible to evacuate the stored charges. The resultant evacuation current on the column $C_j$ is measured by an integrating amplifier.

The photodiode $D_{ij}$ is a pin diode which exhibits good photoelectric characteristics.

Figure 2:
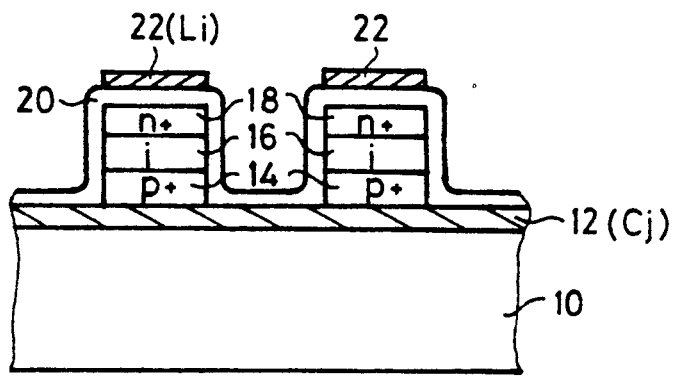
FIG. 2 represents in lateral cross-section one example of practical construction of a matrix of the prior art with a pin photodiode in series with a capacitor at each point of the matrix.

FIG. 2 illustrates a known practical construction corresponding to FIG. 1. This structure can be highly compact since the photodiode ($D_{ij}$) and the capacitor ($C_{ij}$) are formed simply by stacking semiconductor layers (for the diode) and insulating layers (for the capacitor) between the row leads and the column leads.

On an insulating substrate 10, preferably formed of glass which is transparent to the wavelengths to which the photodiodes are sensitive, there is deposited a first array of parallel leads 12 constituting for example, the column leads $C_j$ of FIG. 1 (but this array could also consist of the row leads $L_i$). The material constituting these leads 12 is preferably transparent (indium-tin oxide ITO), especially in the case in which it is desired to restore the potential of the capacitor $C_{ij}$ to a fixed level by means of a light flash at the rear of the substrate after each reading operation.

On the substrate which has thus been covered with an array of row or column leads, the semiconductor layers which serve to form the photodiodes and the insulating layer which serves as a dielectric for the capacitor are deposited so as to superpose a photodiode and a capacitor at each point of the matrix.

In the case of FIG. 2, the photodiodes are first formed, followed by the capacitor. There are therefore successively deposited a semiconductor layer 14 doped in a first conductivity type (p-type, for example), then an intrinsic semiconductor layer 16, then a semiconductor layer 18 doped with an impurity of opposite conductivity type. These semiconductor layers are etched so as to define photodiodes which are insulated with respect to each other. There is then deposited an insulating layer 20, for example of oxide or silicon nitride. Finally, there is deposited a conductive layer 22 which may be transparent or semitransparent in the event that illumination takes place from above. For example, the layer 22 is also of indium-tin oxide ; it is etched in order to define an array of leads which are perpendicular to the leads 12 and cover the photodiodes. If the leads 12 are row leads, then the leads 22 are column leads and conversely.

The semiconductor layers are of hydrogenated amorphous silicon.

By intrinsic layer is meant throughout this description a layer which is not or practically not doped with impurities which are liable to increase its carrier content in positive free charges (p-type impurities) or negative free charges (n-type impurities). But this does not exclude a different doping such as hydrogen doping for saturating the broken bonds of the amorphous silicon or doping with carbon in order to increase the transparency of the semiconductor to certain wavelengths.

For further details on this prior art technique, reference may be made to U.S. Pat. No. 4,797,560.

Figure 3:
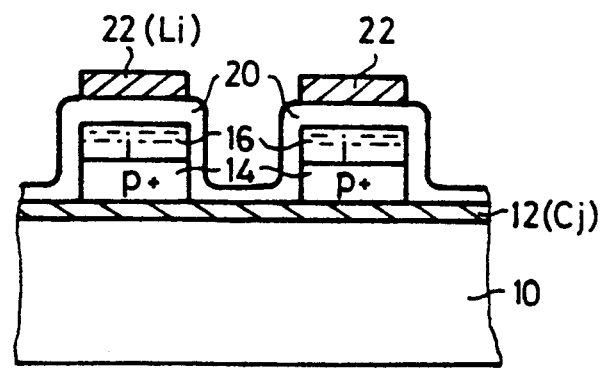
FIG. 3 represents in lateral cross-section one example of construction of a matrix in accordance with the invention.

In accordance with the invention, there is formed a structure such as that of FIG. 3 which is very close to FIG. 2. The sole difference is the absence of the layer 18 beneath the insulating layer 20. The other layers are identical with those of FIG. 2 and are designated by the same references in both figures.

When the structure is illuminated, the potential differences applied between row and column are such that the electron-hole pairs generated by the illumination are divided between charges of one sign which are directed towards the doped layer 14 adjacent to a lead 12 and charges of opposite sign which are directed towards the interface between the intrinsic layer 16 and the insulating layer 20.

In the case of FIG. 3, the doped layer is a p-type layer and electrons accordingly accumulate at the interface between intrinsic layer 16 and insulating layer 20, thus constituting the equivalent of an n-type doped surface layer.

The illumination stage is followed by a reading stage which usually takes place in darkness A voltage pulse is applied between row and column, thus generating an electric field which attracts the stored charges to the doped region 14 and which evacuates them to the lead 12. The evacuation current is measured and integrated by an integrating amplifier which is connected to the column lead.

After the reading stage, provision is usually made for a stage which involves level-resetting of the potentials for the following illumination stage. For example, the photodiodes are illuminated from the rear with an intense light flash followed by forward-biasing of the photodiode by a voltage pulse of lower value than in the reading stage.

Figure 4:
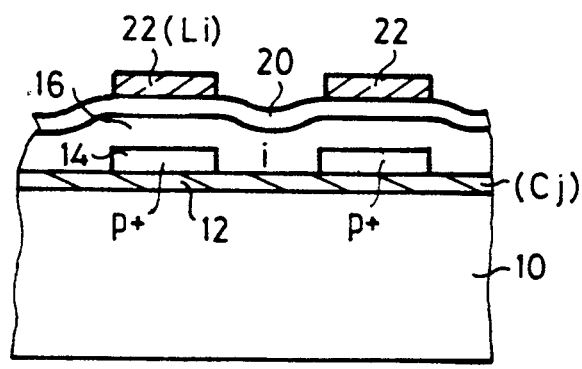
FIG. 4 represents an alternative form of construction of FIG. 3.

In an alternative embodiment shown in FIG. 4, there is no need to etch the intrinsic semiconductor layer 16. Thus, after deposition of the p-type layer 14, this layer is etched in the form of islands corresponding to each photodiode to be formed or in strips corresponding to a row or a column of photodiodes, the strips being intended to cover the conductive strips 12. The intrinsic semiconductor layer 16 is then deposited but not etched, taking into account the fact that it has a high resistivity and that the lateral coupling between adjacent photodiodes is very weak.

In some cases, it could even be decided not to etch the doped layer 14 which is in contact with the lead 12 if its lateral conductivity is sufficiently low to ensure that the pulses for switching into conduction which are applied to the photodiodes of one row are not transmitted to the adjacent rows.

The advantage of these unetched or partially etched structures is to improve the planarization of the structure prior to deposition of the leads 22.

In some instances, it will be found preferable to deposit the capacitor prior to the photodiode, in which case the succession of layers deposited on the substrate is as follows : conducting layer 12, insulating layer 20, intrinsic semiconductor layer 16, doped semiconductor layer 14, conducting layer 22.

Figure 5:
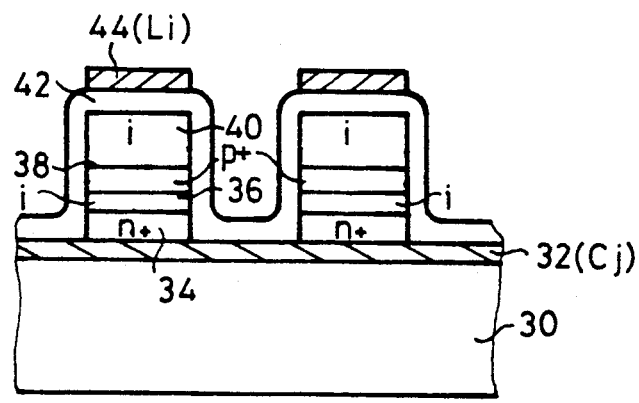
FIG. 5 represents another example of construction of a matrix in accordance with the invention and involving the use of a kind of phototransistor as photosensitive element.

In FIG. 5, there is shown another embodiment in which the photosensitive element is constituted by the superposed assembly of four semiconductor layers and one insulating layer sandwiched between a row lead and a column lead.

The substrate 30 employed is of the same type as that described with reference to the preceding drawings. Row or column leads 32 are deposited on the substrate in the same manner as in FIG. 3.

There are then deposited four successive semiconductor layers made up respectively as follows:
 a layer 34 doped in a first conductivity type, namely n-type in the example shown;
 an intrinsic or quasi-intrinsic layer 36;
 a layer 38 doped in a second conductivity type which is opposite to the first;
 another intrinsic or quasi-intrinsic layer 40.

These four semiconductor layers are etched so as to define separate islands constituting the photosensitive elements of the matrix. These layers are of hydrogenated amorphous silicon as in the case of the photodiode of the preceding figures.

The thickness of the intrinsic layer 36, that is to say the layer which is located between two doped layers of opposite conductivity types, is very small and is, for example, 200 Angströms or less. On the contrary, the intrinsic layer 40 which will be in contact with the insulator of the capacitor is of much greater thickness and preferably at least ten times the thickness. By way of example, the thickness can be within the range of 2000 to 5000 Angströms.

After etching of the semiconductor layers, there is deposited an insulating layer 42 of silicon oxide or nitride, for example, which constitutes the dielectric of the capacitor in series with the photosensitive element.

There is then deposited a conducting layer 44 which is preferably transparent or semi-transparent, for example of indium-tin oxide, which is etched so as to define an array of column leads or row leads which is perpendicular to the array of leads 32 and passes above the islands of amorphous silicon.

The capacitor is defined by a lead 44 on one side of the dielectric 42 and by the intrinsic semiconductor layer 40 on the other side of the dielectric. Electric charges which are generated by the illumination accumulate at the interface 40, 42 under the action of the electric field which is present within the intrinsic layer 40 during illumination.

The operation of the photosensitive point involves the following : operation in three stages consisting respectively of an illumination stage, a reading stage, and a stage of level-resetting of potentials.

During the illumination stage, the voltage applied between rows and columns is such that the base-emitter junction (between layer 38 and layer 34) is slightly reverse-biased and that the electric field in the thick intrinsic region 40 attracts towards the capacitor the minority carriers of the base of the phototransistor, that is to say of the layer 38. In the case of a nipi structure, the potential will be positive on the i side and negative on the n side and the electrons will be carried towards the capacitor.

More precisely, the illumination generates in the thick intrinsic region charge carriers which accumulate on the base and release the emitter-base junction which is only very slightly reverse-biased. This results in a strong current of minority carriers (stronger as the gain of the phototransistor is higher). These carriers accumulate on the capacitor and are greater in number than the carriers initially generated by the illumination in the intrinsic region 40.

The carriers which have accumulated at the interface between the intrinsic region 40 and the insulator of the capacitor recreate artificially the n-doped region which has purposely been suppressed.

In the reading stage, usually performed in darkness, a voltage pulse is applied to the row lead in a direction which reverses the electric field in the thick intrinsic region 40. The stored charges are evacuated towards the doped region 34 and towards the conductor 32 with which the region is in contact.

The reading voltage pulse has a small amplitude, even in the dark, and is of the same order as that employed for a photodiode by virtue of the presence and small thickness of the thinnest intrinsic region 36. The current for evacuation of stored charges can be read and integrated from the column lead, whether this latter is the lead 32 or the lead 34.

In a stage of level-resetting of the initial potentials in anticipation of a fresh reading stage, the phototransistor can be illuminated from the rear of the substrate and a reading operation can be carried out with calibrated voltage pulses of a lower value than those employed during the reading stage proper.

Figure 6:
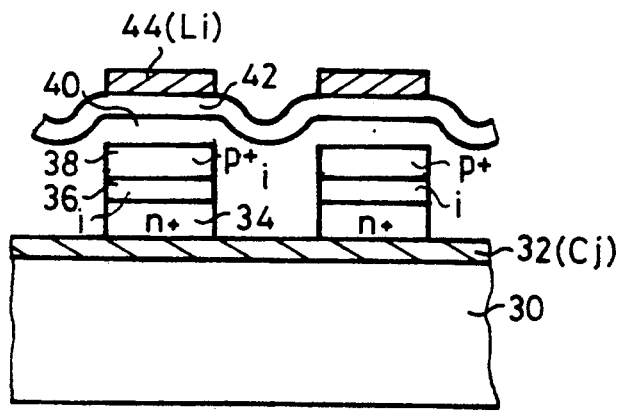
FIG. 6 represents an alternative form of construction with phototransistor.

In an alternative embodiment shown in FIG. 6, the first three semiconductor layers 34, 36, 38 are first deposited, then etched so as to define islands corresponding to each photosensitive element, whereupon the last intrinsic layer 40 is deposited, namely the layer which will be in direct contact with the insulator of the capacitor and which is not etched. By reason of its thickness, the structure is appreciably planarized, thus facilitating subsequent deposition of the metal layer 44. The disadvantage of this structure lies in the danger of leakages of charges between adjacent photosensitive elements but this risk is small, taking into account the high resistivity of the intrinsic layer 40.

The invention is applicable to all types of photosensitive devices including radiological imaging devices in which a scintillator deposited on the matrices described in the foregoing converts an x-radiation to a radiation within the range of wavelengths to which the pi, nipi or pini structures described above are sensitive. The scintillator can also be deposited on the substrate 10 or 30 prior to formation of the photosensitive points.

What is claimed is:

1. An array of photosensitive elements in which each photosensitive point in provided between a row lead and a column lead with a photosensitive element in series with a capacitor, said capacitor storing the charges generated by illumination of the associated photosensitive element, the photosensitive element being provided with at least one intrinsic or quasi-intrinsic layer, wherein the capacitor is constituted by:
   said intrinsic or quasi-intrinsic layer in which charges accumulate as the illumination takes place;
   a dielectric layer in contact with said intrinsic or quasi-intrinsic layer;
   and a row or column lead in contact with the dielectric layer.

2. An array of photosensitive elements according to claim 1, wherein the photosensitive element comprises the intrinsic or quasi-intrinsic layer in contact on one side with said dielectric layer and on the other side with a doped semiconductor layer.

3. An array of photosensitive elements according to claim 2, wherein each photosensitive point involves superposition on a substrate, of a portion of row or column lead, a doped semiconductor layer, an intrinsic or quasi-intrinsic semiconductor layer, a dielectric layer and a portion of column or row lead.

4. An array of photosensitive elements according to claim 2, wherein each photosensitive point involves superposition on a substrate, of a portion of row or column lead, a dielectric layer, an intrinsic semiconductor layer, a doped semiconductor layer and a portion of column or row lead.

5. An array of photosensitive elements according to claim 2, wherein the photosensitive elements are defined by etching of the doped semiconductor layer whilst the intrinsic layer is not etched and extends uniformly between the photosensitive elements thus defined.

6. An array of photosensitive elements according to claim 1, wherein the photosensitive element comprises the superposed assembly of a first doped semiconductor layer of a first conductivity type, a first intrinsic or quasi intrinsic thin semiconductor layer, a second doped semiconductor layer of a second conductivity type, and a second intrinsic or quasi-intrinsic semiconductor layer which has a greater thickness than the first intrinsic or quasi-intrinsic layer and which is in contact with said dielectric layer.

7. An array according to claim 6, wherein the photosensitive point comprises a superposed assembly of the following layers on a substrate;
   a conducting layer deposited on the surface of said substrate,
   said first doped semiconductor layer,
   said first intrinsic or quasi intrinsic layer
   said second doped semiconductor layer,
   said second intrinsic or quasi intrinsic layer
   the dielectric layer
   another conductive layer.

8. An array according to claim 7, wherein the different photosensitive points are defined by etching of a number of semiconductor layer in the form of separate islands, each corresponding to a respective photosensitive element, and other semiconductor layers, including said second intrinsic or quasi intrinsic semiconductor layer, are not etched.

9. An array of photosensitive points, comprising:
a plurality of row leads;
a plurality of column leads;
wherein each photosensitive point is formed between a respective selected row lead and column lead;
a photosensitive element in series with a capacitor forming each photosensitive point;
wherein the photosensitive element comprises at least one intrinsic or quasi-intrinsic layer;
wherein each capacitor stores charges generated by illumination of the photosensitive element which the capacitor is in series with, each capacitor comprising:
   the intrinsic or quasi-intrinsic layer forming the photosensitive element which the capacitor is in series with, charges accumulating in this intrinsic or quasi-intrinsic layer as the illumination takes place;
   a dielectric layer in contact with said intrinsic or quasi-intrinsic layer; and
   a row or column lead in contact with the dielectric layer.

10. An array of photosensitive elements according to claim 9, wherein each photosensitive element further comprises the intrinsic or quasi-intrinsic layer in contact on one side with said dielectric layer and on the other side with a doped semiconductor layer.

11. An array of photosensitive elements according to claim 9, wherein each photosensitive element further comprises a superposed assembly of a first doped semiconductor layer of a first conductivity type, a first intrinsic or quasi-intrinsic thin semiconductor layer, a second doped semiconductor layer of a second conductivity type, and a second intrinsic or quasi-intrinsic semiconductor layer which has a greater thickness than the first intrinsic or quasi-intrinsic layer and which is in contact with said dielectric layer.

12. An array according to claim 1, wherein the semiconductor layers are of hydrogenated amorphous silicon.

* * * * *